(12) United States Patent
Ausserlechner et al.

(10) Patent No.: US 9,370,113 B2
(45) Date of Patent: Jun. 14, 2016

(54) POWER SEMICONDUCTOR MODULE WITH CURRENT SENSOR

(71) Applicant: Infineon Technologies AG, Neubiberg (DE)

(72) Inventors: Udo Ausserlechner, Villach (AT); Andreas Grassmann, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/795,348

(22) Filed: Jul. 9, 2015

(65) Prior Publication Data
US 2016/0014916 A1 Jan. 14, 2016

(30) Foreign Application Priority Data

Jul. 14, 2014 (DE) .......................... 10 2014 109 816

(51) Int. Cl.
| | | |
|---|---|---|
| H01L 25/07 | (2006.01) |
| G01R 31/28 | (2006.01) |
| H05K 5/00 | (2006.01) |
| G01R 31/26 | (2014.01) |
| G01R 19/00 | (2006.01) |
| H01L 23/367 | (2006.01) |
| H01L 23/473 | (2006.01) |

(Continued)

(52) U.S. Cl.
CPC .......... *H05K 5/0065* (2013.01); *G01R 19/0092* (2013.01); *G01R 31/2644* (2013.01); *G01R 31/2884* (2013.01); *H01L 23/3675* (2013.01); *H01L 23/473* (2013.01); *H01L 25/07* (2013.01); *H01L 25/105* (2013.01); *H05K 1/0203* (2013.01); *H05K 1/0296* (2013.01); *H05K 1/181* (2013.01); *H01L 2224/48091* (2013.01); *H01L 2224/49171* (2013.01); *H05K 2201/10151* (2013.01); *H05K 2201/10287* (2013.01); *H05K 2201/10416* (2013.01)

(58) Field of Classification Search
CPC ........... G01R 19/0092; G01R 31/2644; G01R 31/2884; H01L 25/07
See application file for complete search history.

(56) References Cited

U.S. PATENT DOCUMENTS 6,236,110 B1 * 5/2001 Muto ....................... G01R 1/20
257/724
6,958,534 B2 * 10/2005 Stockmeier ......... H01L 23/3735
257/690

(Continued)

FOREIGN PATENT DOCUMENTS

| DE | 10045563 A1 | 4/2001 |
| DE | 102010053392 A1 | 6/2012 |
| DE | 102011076323 A1 | 11/2012 |

*Primary Examiner* — Evan Pert
(74) *Attorney, Agent, or Firm* — Murphy, Bilak & Homiller, PLLC (57) ABSTRACT

A power semiconductor module includes a power electronics substrate having a first surface, a second surface opposite the first surface, a first longitudinal side, a second longitudinal side opposite the first longitudinal side, a module frame, which is arranged to enclose the power electronics substrate, at least one power terminal which is arranged at the first longitudinal side and extends through the module frame, a further terminal, which is arranged at the second longitudinal side and extends through the module frame, at least one power semiconductor component which is arranged on the first surface of the power electronics substrate and is electrically connected to at least one power terminal, and at least one current sensor which is designed to measure a current in a power terminal. The at least one current sensor is arranged on the power terminal and has a signal output connected to the further terminal.

21 Claims, 9 Drawing Sheets

(51) Int. Cl.
  H01L 25/10 (2006.01)
  H05K 1/02 (2006.01)
  H05K 1/18 (2006.01)

(56) References Cited

U.S. PATENT DOCUMENTS

| | | | |
|---|---|---|---|
| 7,102,376 B2 * | 9/2006 | Iwagami | H01L 23/34 257/E23.08 |
| 7,327,117 B2 * | 2/2008 | Iotti | G01R 19/0092 318/432 |
| 7,479,693 B2 * | 1/2009 | Kondou | H01L 25/162 257/678 |
| 8,885,344 B2 * | 11/2014 | Asakura | H01L 23/4006 165/80.2 |
| 9,007,767 B2 * | 4/2015 | Nakajima | H02M 7/003 165/80.4 |
| 2005/0007139 A1 * | 1/2005 | Iwagami | H01L 23/34 324/105 |

* cited by examiner

POWER SEMICONDUCTOR MODULE WITH CURRENT SENSOR

PRIORITY CLAIM

This application claims priority to German Patent Application No. 10 2014 109 816.1 filed on 14 Jul. 2014, the content of said application incorporated herein by reference in its entirety.

TECHNICAL FIELD

The invention relates to the field of power semiconductor modules, in particular power semiconductor modules with load current measurement at an external load terminal.

BACKGROUND

Power semiconductor modules usually comprise a power electronics substrate, on which a plurality of power semiconductor components (for example semiconductor switches such as IGBTs (insulated-gate bipolar transistors) or MOSFETs (metal oxide-semiconductor field-effect transistors) are arranged. The power electronics substrate can be fixed (e.g., adhesively bonded) directly in a housing part (a so-called module frame). Alternatively, the power electronics substrate can also be fixed (e.g., soldered) on a metallic baseplate, which is in turn arranged on a module frame. In this case, the baseplate practically forms the housing base of the power semiconductor module. The module frame is usually produced from plastic and in the injection-molding method, for example.

The power electronics substrate can be in particular a DCB substrate (DCB=double copper bonded), a DAB substrate (DAB=double aluminum bonded) or an AMB substrate (AMB=active metal braze), in which the insulation carrier usually consists of ceramic. A further power electronics substrate is the so-called IMS substrate (IMS=insulated metal substrate), in which a metallic carrier is insulated from the metallization by a thin insulation layer. A metallization is arranged on both sides of the carrier (insulated metal or ceramic). The metallization on the top side is structured and therefore has conductor tracks, soldering pads and bonding pads and the like. The metallization on the underside is usually over the whole area.

The power semiconductor components arranged on the substrate are generally soldered by their rear side (underside) onto the metallization at the top side. The power semiconductor components are usually contacted with metallic terminal areas (bonding pads) on the insulating substrate by means of bonding wires. Terminal lines, e.g., contact pins, form external terminals which are led through the housing and enable the terminal areas to be contacted externally.

Semiconductor modules and in particular power semiconductor modules generate heat during operation at high currents and voltages, which heat, if it is not correspondingly dissipated, reduces the power and lifetime of the modules. In the case of power semiconductor components and modules, in the case of correspondingly high power losses, liquid cooling is usually used in order to ensure sufficient heat dissipation.

In the case of direct liquid cooling, the power semiconductor module has heat exchangers (e.g., heat sinks) at its underside, which absorb the heat from the components and transfer the heat to the cooling liquid by virtue of the direct contact therewith. Consequently, the cooling liquid is heated while it flows along the underside of the module, the temperature of the cooling liquid getting ever closer to the operating temperature of the module. Often a multiplicity of power semiconductor modules are arranged one behind another along a single heat sink. In this case, the heat sink can be for example an elongated straight heat sink or a U-shaped heat sink. Arrangements are also known in which a further heat sink is arranged on the top side of the power semiconductor modules in order to double the area for dissipating heat.

In many applications it is desirable to measure the current flowing through at least one of the external terminals. However, the space for a current measuring arrangement is limited on account of the close arrangement of the power semiconductor modules along the heat sink or heat sinks. In addition, electrical isolation of the power semiconductor module and the evaluation electronics is required. In known arrangements, therefore, current measuring arrangements are connected to the corresponding terminals of the power semiconductor module externally by means of a busbar. The current supply of the current measuring arrangements and the data transfer to a control and/or evaluation module are implemented here by means of corresponding supply and data lines. However, a large amount of additional space is required for the current measurement in the case of such arrangements as a result of the additional current measuring arrangements.

SUMMARY

The problem addressed by the embodiments of the invention described herein is to provide a power semiconductor module in which the current measuring arrangement for measuring the current of at least one terminal line is implemented in a manner that saves as much space as possible.

A power semiconductor module is disclosed. According to an embodiment, the module includes a power electronics substrate having a first surface, a second surface opposite the first surface, a first longitudinal side and a second longitudinal side opposite the first longitudinal side. The power semiconductor module furthermore comprises a module frame, which is arranged in such a way that it encloses the power electronics substrate, at least one power terminal which is arranged at the first longitudinal side and which extends through the module frame, a further terminal, which is arranged at the second longitudinal side and which extends through the module frame, at least one power semiconductor component which is arranged on the first surface of the power electronics substrate and is electrically connected to at least one power terminal, and at least one current sensor which is designed to measure a current in a power terminal, wherein the at least one current sensor is arranged on the power terminal and has a signal output connected to the further terminal.

A system including at least two power semiconductor modules is disclosed. According to an embodiment, the at least two power semiconductor modules comprise a common cooling device, which runs along the second surface of the power electronics substrate and which is designed to cool the power electronics substrate and the power semiconductor components arranged thereon.

BRIEF DESCRIPTION OF THE DRAWINGS

The invention is explained in greater detail below on the basis of the examples illustrated in the figures. The illustrations are not necessarily true to scale and the invention is not restricted just to the aspects illustrated. Rather, importance is attached to illustrating the principles underlying the invention. In the figures.

DETAILED DESCRIPTION

In the figures, identical reference signs designate identical or similar component parts having in each case an identical or similar meaning.

Figure 1:
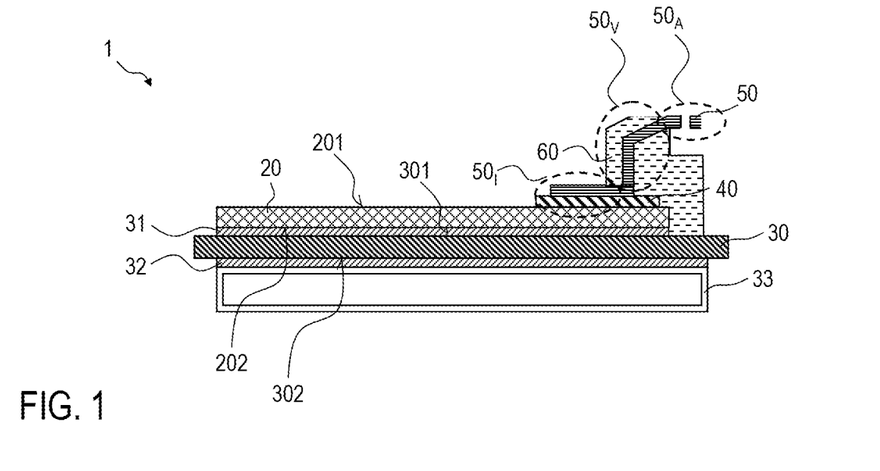
FIG. 1 shows a schematic cross-sectional illustration of a power semiconductor module with an external terminal, according to an embodiment.
Figure 2:
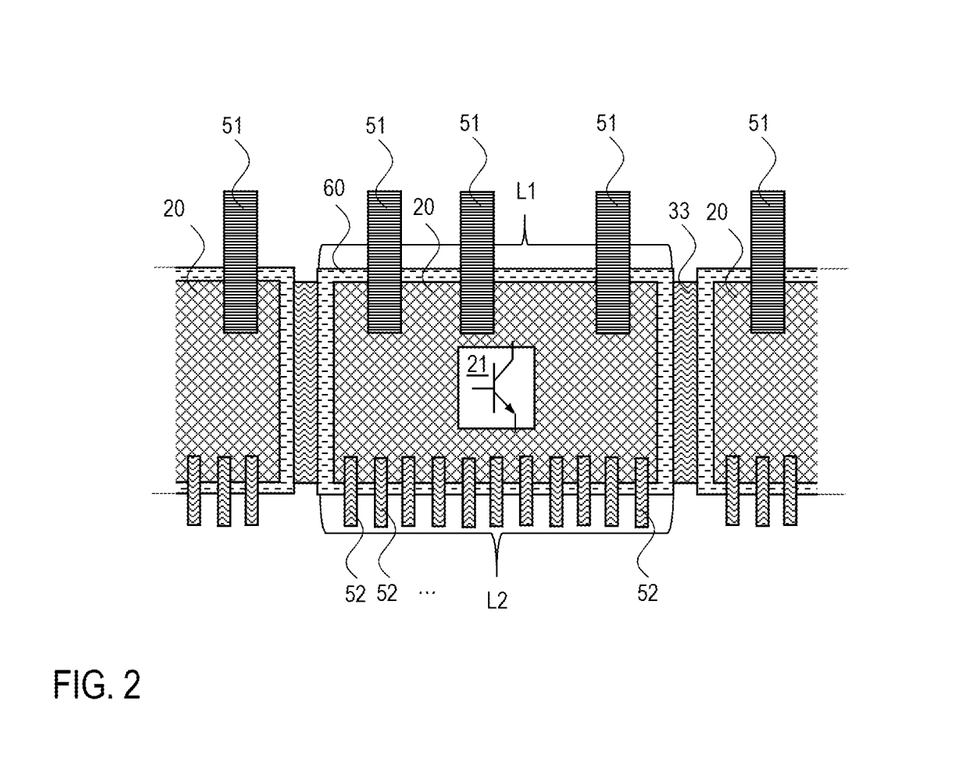
FIG. 2 shows a schematic plan view of a power semiconductor module with power terminals and further terminals, according to an embodiment.

Firstly, one example of a power semiconductor module 1 is described very generally with reference to the schematic illustration illustrated in FIGS. 1 and 2. The module 1 comprises a power electronics substrate 20 having a first surface 201 and a second surface 202 opposite the first surface 201. The power electronics substrate 20 comprises for example a dielectric insulation carrier, which is generally provided with an upper metallization and with a lower metallization (neither of which is illustrated in FIG. 1). In this case, the insulation carrier serves to electrically insulate the upper metallization relative to the lower metallization. The power electronics substrate 20 can be in particular a DCB substrate (DCB=double copper bonded), a DAB substrate (DAB=double aluminum bonded) or an AMB substrate (AMB=active metal braze), in which the insulation carrier usually consists of ceramic. A further power electronics substrate is the so-called IMS substrate (IMS=insulated metal substrate), in which a metallic carrier is insulated from the metallization by a thin insulation layer. A metallization is arranged on both sides of the carrier (insulated metal or ceramic). The metallization on the top side is structured and therefore has conductor tracks, soldering pads and bonding pads and the like. The metallization on the underside is usually over the whole area.

The power electronics substrate 20 is connected to the first surface 301 of a baseplate 30 by means of a connection layer 31 (e.g., a solder layer). The baseplate 30 can comprise or consist of an electrically conductive metal plate (e.g., composed of copper or aluminum), which on its surface can optionally be provided with a thin material layer, e.g., composed of nickel, for improving the solder-ability of the baseplate 30. In one embodiment, the baseplate 30 can be a 3 mm thick aluminum plate. In other embodiments, however, the baseplate 30 can also be a 0.2 mm thick copper plate, for example. However, other thicknesses and materials are also possible for the baseplate 30. The power electronics substrate 20 can be connected to the baseplate 30 by soft soldering or by means of an adhesive-bonding method, for example.

A cooling device 33 is connected to a second surface 302 of the baseplate 30 by means of a second connection layer 32, wherein the second surface 302 is arranged opposite the first surface 301. The cooling device 33 can be a cooling tube, for example, through which a cooling medium or a cooling liquid flows in the interior thereof. The cooling liquid is heated while it flows along the underside of the power semiconductor module 1. As illustrated in FIG. 2, a plurality of power semiconductor modules 1 can be arranged along a cooling device 33. In this case, the cooling device 33 can be an elongated straight cooling tube, for example, or e.g., also have a U-shape.

The baseplate 30 and the substrate 20 of a power semiconductor module 1 are normally rectangular and thus have two longer sides (designated hereinafter as longitudinal sides L1, L2) and two shorter sides (designated hereinafter as transverse sides). Direction indications are correspondingly indicated as longitudinal and transverse directions. However, the geometrical configuration of semiconductor modules 1 can also be square. In this case, the longitudinal and transverse sides would be of the same length. However, non-square embodiments are described in the following examples.

One of a plurality of power semiconductor chips 21 are arranged on the power electronics substrate 20. In this case, each of the power semiconductor chips 21 can comprise a controllable power semiconductor switch, for example an IGBT (insulated-gate bipolar transistor), a MOSFET (metal-oxide-semiconductor field-effect transistor) or a JFET (junction field-effect transistor). In this case, a power semiconductor switch normally has a load path and also a control terminal. The number and type of the power semiconductor chips 21 arranged on the power electronics substrate 20 are arbitrary, however, and depend on the respective application.

The power semiconductor chips 21 can be mechanically and also electrically conductively connected to the upper metallization by means of soldering or sintering, for example. The top sides of the semiconductor chips 21 can be electrically connected to corresponding bonding pads of the metallization electrically for example with the aid of bonding wires. A module frame 60 encloses the power electronics substrate 20. The module frame 60 forms the side walls of a module housing. It is usually produced from plastic and can be produced in the injection-molding method, for example. The power semiconductor module 1 can be closed by a housing cover (not illustrated). The latter can be placed onto the module 1, for example. However, module frame 60 and housing cover can also be embodied integrally, for example. The interior of the module 1 can be filled with insulation compound or potting compound.

A power semiconductor module 1 comprises a number of terminal elements 50 (often rectangular in cross section) which enable an external electrical connection of the module 1 to other elements such as, for example, voltage supply units or other external electronic components. In this context, external means "outside the module housing". Within the module frame 60, the terminal elements 50 have an inner section $50_I$, which is electrically connected to the first surface 201 and/or to one or a plurality of the power semiconductor chips 21. The electrical connection can be produced by means of a connection layer 40, for example. The connection layer 40 can comprise for example a thin layer composed of copper. A connection section $50v$ of the terminal elements 50 extends through the module frame 60. Outside the module frame 60, the terminal elements 50 have an outer section $50_A$, which projects from the module frame 60. The outer sections $50_A$ form the external terminals of the module 1. The outer sections $50_A$ of the terminal elements 50 can have a drilled hole in order to be able to connect the terminal elements 50 to external components. The terminal elements 50 can be plug contacts, for example, which are arranged in groups provided therefore in the module frame 60. However, the terminal elements 50 can for example also be molded into the module housing as early as during the production of the module frame 60.

In many applications, two or more terminal elements 50 are provided as power terminals 51. Said power terminals 51 can be connected to solid busbars outside the module 1, the load current being fed in and conducted away via said busbars. Depending on the nominal load current intensity, the power terminals 51 have a cross section of corresponding size (for example 8 mm×1 mm). The power terminals 51, as illustrated in FIG. 2, are arranged along a first longitudinal side L1 of the module 1. That is to say that the power terminals 51 are arranged on the first longitudinal side L1 alongside one another near the outer edge of the power electronics substrate 20 and project from the module 1 on the first longitudinal side L1.

Besides the power terminals 51, the power semiconductor module 1 comprises further terminals 52, which are not power terminals and which are normally connected to an external control circuit board. Microprocessors, level shifters or storage elements can be arranged on the control circuit board (not illustrated). The further terminals 52 are arranged alongside one another along the second longitudinal side L2. Consequently, the power terminals 51 and the further terminals 52 are arranged on opposite longitudinal sides of the module 1. In the figures, the power terminals 51 and the further terminals 52 are illustrated in such a way that they are led toward the outside laterally through the module frame 60. However, the terminals 51, 52 can also be led out from the power semiconductor module 1 upward perpendicularly to the first surface 201. If the terminals 51, 52 are led out from the power semiconductor module upward, then for example external components (e.g., a control circuit board) can be placed directly onto the power semiconductor module 1 and can be contacted with the terminals. The external components can have holes for this purpose, for example, into which the terminals 51, 52 can be plugged. In the case of such an arrangement, however, the top side of the power semiconductor module 1 is no longer available for providing a further cooling device.

Figure 3:
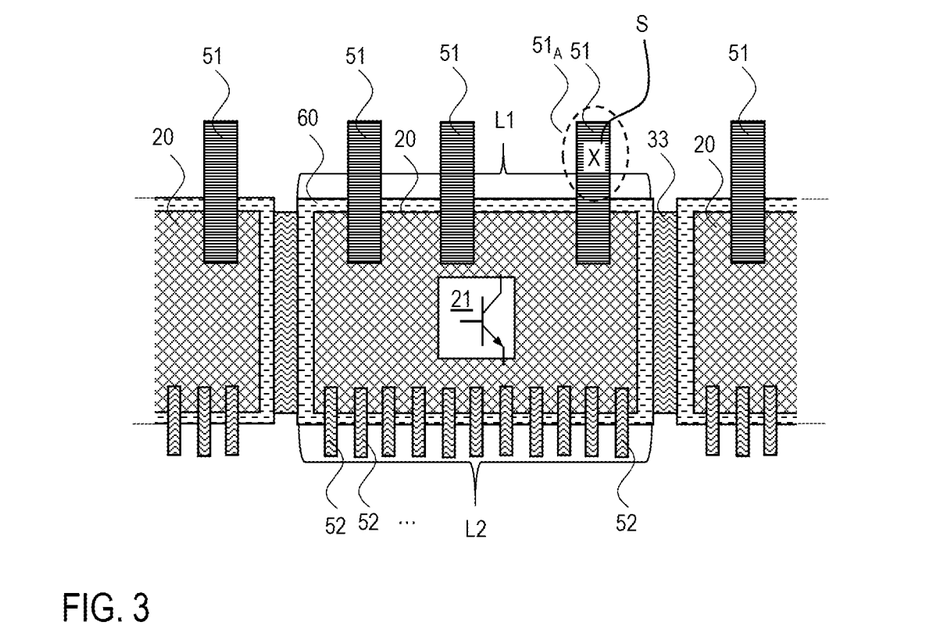
FIG. 3 shows a schematic plan view of a power semiconductor module with power terminals and a current sensor arranged at a first position, according to an embodiment.

In order to measure a current in one of the power terminals 51, the power semiconductor module 1 comprises a current sensor S. Said current sensor S is arranged at or on the corresponding power terminal 51. In accordance with the embodiment illustrated in FIG. 3, the current sensor S in this case is arranged at a first position X on the outer section $51_A$ of the power terminal 51. That is to say that the current sensor S is arranged outside the module frame 60. The arrangement outside the module frame 60 has the advantage that the sensor S does not require any space in the module 1. However, in the case of an arrangement at the first position X, a problem arises with the insulation of the sensor S, since the terminal lines of the sensor S have to be at a minimum distance from the power terminal 51. This necessitates a larger sensor S, which is also more expensive on account of its size.

Figure 4:
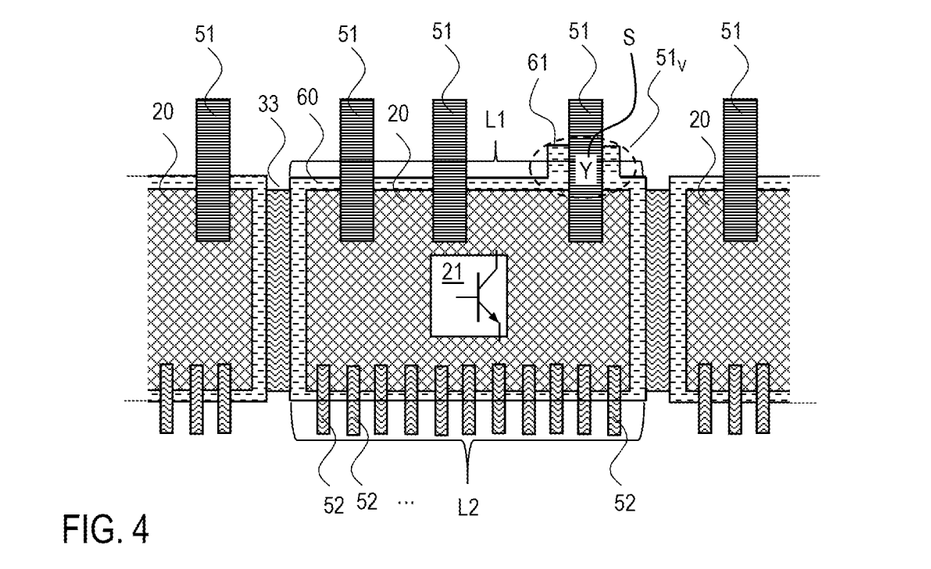
FIG. 4 shows a schematic plan view of a power semiconductor module with power terminals and a current sensor arranged at a second position, according to an embodiment.

As illustrated in FIG. 4, however, the current sensor S can also be arranged at a second position Y, or at the connection section $51v$ of the power terminal 51. That is to say that the sensor S is enclosed by the module frame 60 on all sides. The sensor S can be concomitantly molded into the module frame 60 for example during the production of the module frame 60. If the module frame 60 is produced in the injection-molding method, for example, then the injection-molding method can be carried out in two steps. In this regard, by way of example, a first step can involve molding a first part of the module frame 60, which stabilizes the constituent parts of the power semiconductor module 1, with the exception of the current sensor S. The latter is fitted on the power terminal 51 in a second step only after the production of the first part of the module frame 60. The electrical connections necessary for the sensor S are also produced in said second step. Afterward, in a third step, the sensor S is also encapsulated by molding, such that the sensor S and its electrical connections are also stabilized and held fixedly on their respective positions.

In the case of the arrangement of the sensor S at the second position Y, the module frame 60 can have a projection 61, for example, which completely encloses the sensor S. The projection 61 can be provided, for example, if the module frame 60 has only a comparatively small thickness in relation to the dimensions of the current sensor S. By virtue of the additional material of the projection 61, the sensor S can be enclosed with enough material on all sides. It is not necessary here to increase the thickness of the module frame 60 over the entire circumference thereof. Consequently, only a minimum of additional material is required for forming the projection 61. The current sensor S has a thermal coupling to the power electronics substrate 20 and thus to the cooling device 33 at the second position Y on account of the thermal conductivity of the power terminal 51. A good thermal coupling of the current sensor S to the cooling device 33 can be advantageous since locally increased current densities can occur in some arrangements. The sensor S is additionally also protected against mechanical influences at the second position Y since it is enclosed here by the material of the module frame 60. By virtue of the arrangement in the module frame 60, the sensor S also does not require additional space on the power electronics substrate 20. A good insulation of the sensor S is additionally ensured. Problems often arise with small creepage paths between components having a high potential (e.g., 500V or 10 kV), such as the power terminal 50, for example, and components having a low potential (e.g., 5V or 42V), such as terminals of the current sensor S, for example. This problem can be reduced by the sensor S being encapsulated with the material of the module frame 60 at the second position Y. The creepage path is generally defined as the shortest path between two conductive parts that is measured along a surface of an insulation.

Figure 5:
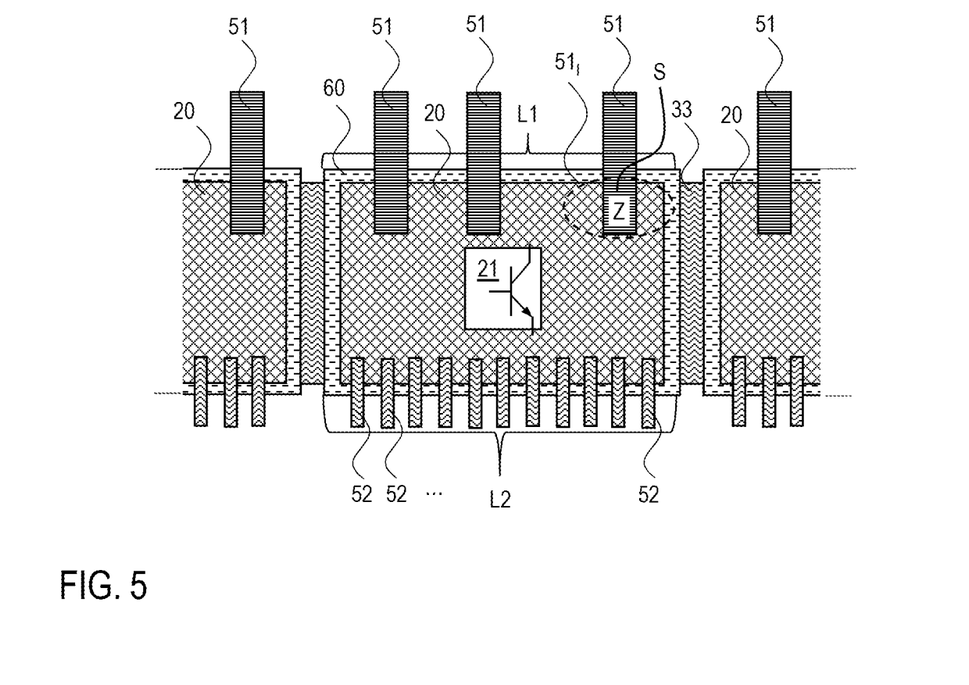
FIG. 5 shows a schematic plan view of a power semiconductor module with power terminals and a current sensor arranged at a third position, according to an embodiment.

The sensor S can, as illustrated in FIG. 5, also be arranged at a third position Z on the inner section $51_I$ of the power terminal 51. That is to say that the current sensor S is arranged within the module frame 60. The arrangement of the sensor S within the module frame 60 has the advantage that the problems of small creepage paths are reduced by the potting compound situated in the interior of the module 1. The sensor S is additionally in close contact with the power electronics substrate 20. By virtue of the proximity to the power electronics substrate 20, an effective cooling is implemented by the cooling device 33 arranged on the underside of the module 1. In this regard, the sensor S can be well protected against excessively high temperatures which can occur in overcurrent states, for example. Furthermore, the sensor S is better protected against external forces by the arrangement in the interior of the housing. External forces can occur for example when the module 1 is incorporated into an application (e.g., when the power terminals 51 are connected to a busbar).

Particular problems can arise upon the occurrence of external forces in principle particularly if the sensor S is insulated from the power terminal 51 by an intermediate insulation layer (e.g., glass or ceramic lamina). Such intermediate insulation layers are very fragile, and so even a small mechanical action can lead to fractures or cracks which can cause voltage failures or reduced lifetime of the insulation. What is disadvantageous is that the sensor S requires space on the power electronics substrate 20.

A projection 61 such as is illustrated in FIG. 4 can also be provided, for example, if the sensor S is arranged at the third position Z. In this case, too, an improved stability of the power terminal 51 can be achieved by the provision of a projection 61.

Figure 6:
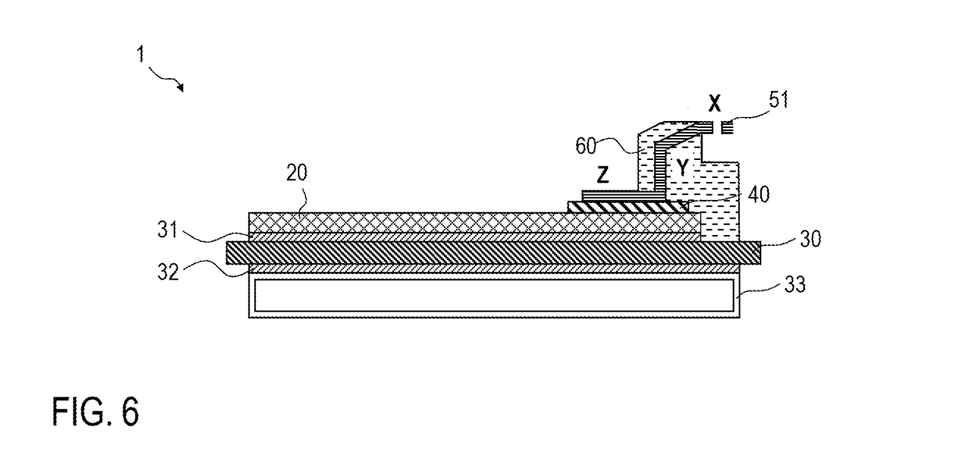
FIG. 6 shows a schematic cross-sectional illustration of a power semiconductor module with a power terminal, according to an embodiment.

FIG. 6 illustrates a schematic cross-sectional illustration of a power semiconductor module 1 with a power terminal 51. The three possible positions X, Y, Z of the current sensor S on the inner section $51_I$, on the connection section $51v$ and on the outer section $51_A$ are illustrated in this case.

Figure 7:
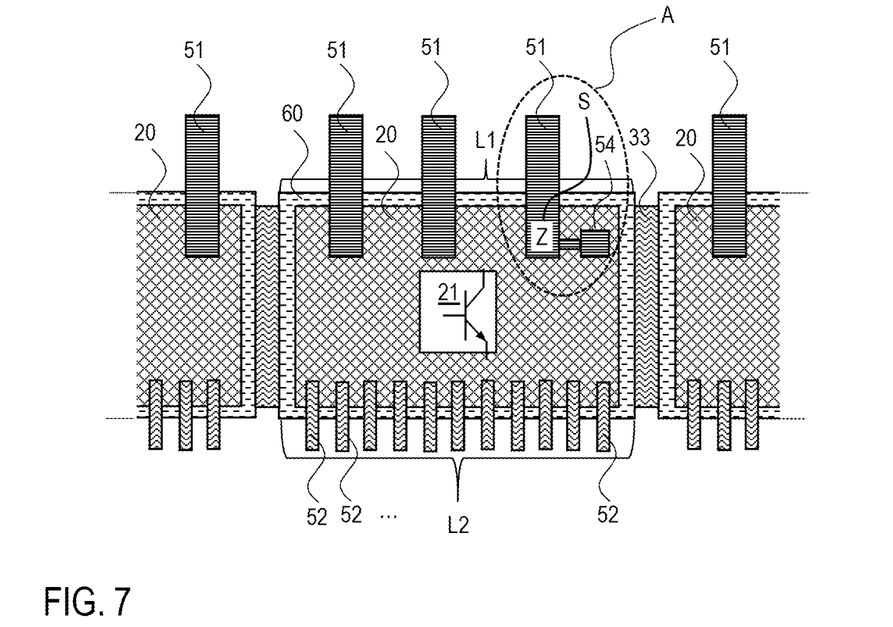
FIG. 7 shows a schematic plan view of a power semiconductor module with power terminals and a current sensor arranged at the third position, according to an embodiment.

If the current sensor S is arranged at the third position Z, the inner section $51_I$ of the power terminal 51 can have a contact section 54. A power semiconductor module 1 comprising such a contact section 54 is illustrated in FIG. 7. The contact section 54 can be a square or rectangular section, for example, which is connected to the power terminal 51 by means of a bridge 53. The contact section 54, like the inner section $51_I$ of the power terminal 51, can be connected to the power electronics substrate 20 by means of a connection layer. The contact section 54 thus enlarges the bearing area of the power terminal 51, as a result of which the stability thereof increases. The bridge 53 constitutes a tapering of the power terminal 51.

Figure 8:
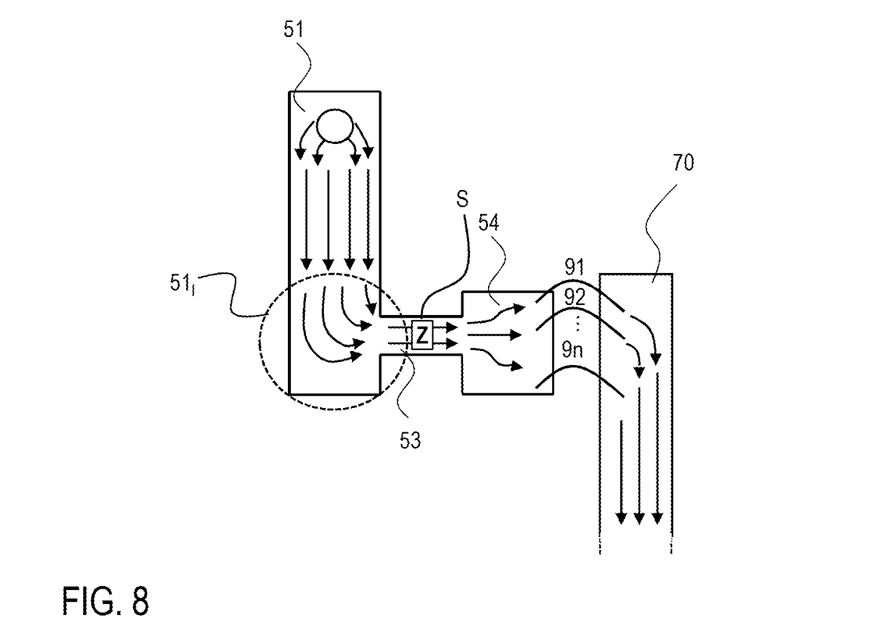
FIG. 8 shows a schematic plan view of a power terminal with a current sensor at the third position, according to an embodiment.

A power terminal 51 having a contact section 54 is illustrated in greater detail in FIG. 8 (excerpt A in FIG. 7). The drilled hole via which (e.g., by means of a screw) a connection to an external busbar, for example, can be introduced is indicated in the outer section $51_A$ of the power terminal 51. The sensor S can be arranged on the bridge 53 in such an arrangement. The inner section $51_I$ of the power terminal 51 can be mechanically connected to the power electronics substrate 20 by means of a connection layer 40. In this case, however, the inner section $51_I$ has no electrical function, but rather serves only as a contact area ("anchor") in order to protect the bridge 53 against force actions, for example via the outer section $51_A$. The power terminal 51 is connected to the power electronics substrate 20 more fixedly by said "anchor" and thus protects the power terminal 51 better against mechanical loads. In addition, it improves the cooling of the bridge 53, at which the current lines are compressed, since the generated heat loss in the region of the bridge 53 can be dissipated toward two sides toward the power electronics substrate 20. As a result, the thermal resistance can be halved in comparison with the thermal resistance in the case of an arrangement of the current sensor S at the second position Y. The current lines are indicated by arrows in FIG. 8. The contact section 54 is connected to a conductor track 70 by means of bonding wires 91, 92, ..., 9n. The current flowing via the power terminal 51 flows via the contact section 54 from and to the conductor track 70. The conductor track 70 can connect the power terminal 51 for example to a load path terminal of a power semiconductor switch 21 arranged on the power electronics substrate 20. Bonding wires are suitable in principle for electrical and thermal connection of the contact section 54 and the conductor tracks 70. In arrangements in which the contact section 54 is a solid stamped part (e.g., composed of copper having a cross section of 8 mm×1 mm), for example, and the conductor tracks 70 consist of a significantly thinner metallization layer (e.g., having a thickness of 200 μm) on the top side of the power electronics substrate 20, bonding wires can be advantageous. However, it is also possible to connect the conductor tracks 70 to the contact section 54 directly by means of a sufficiently conductive connection layer.

Figure 9:
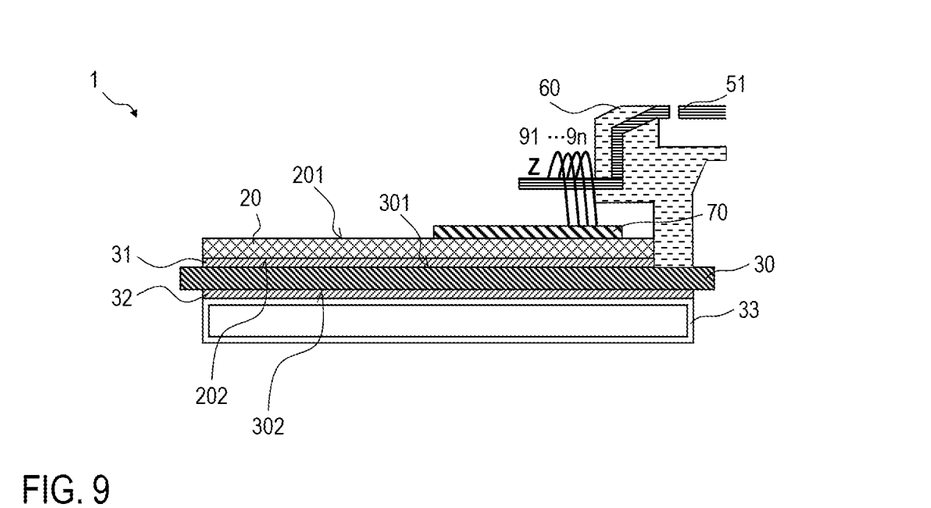
FIG. 9 shows a schematic cross-sectional illustration of a power semiconductor module with a power terminal and a current sensor, according to an embodiment.

The power terminal 51 having the inner section $51_I$, the bridge 53 and the contact section 54 can be connected directly to the power electronics substrate 20 by means of a connection layer 40 (e.g., a solder layer), as already explained with reference to FIG. 6. However, the power terminal 51 can also be arranged at a distance away from the power electronics substrate 20, as illustrated schematically in FIG. 9. The power terminal 51 can then once again, as described with reference to FIG. 8, be connected to the conductor track 70 by means of bonding wires 91, 92, ..., 9n, said conductor track being arranged on the power electronics substrate 20. In this way, the space below the inner section $51_I$, the bridge 53 and the contact section 54 can be used to arrange further components or conductor tracks there, for example.

Figure 10:
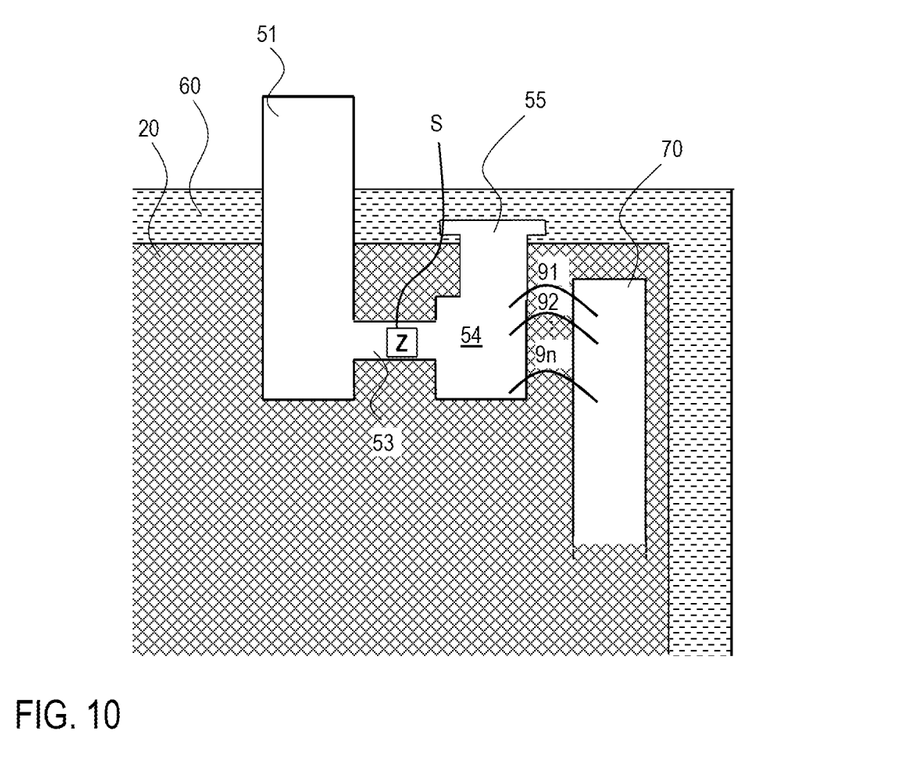
FIG. 10 shows a schematic plan view of a power semiconductor module with a power terminal and a current sensor at the third position, according to an embodiment.

In order to stabilize the power terminal 51, the contact section 54 can furthermore have an "anchoring" 55, which projects from the contact section 54 into the module frame 60 and is potted therein. An arrangement in which the contact section 54 has such an anchoring 55 is illustrated by way of example in FIG. 10. The entire power terminal 51 having the bridge 53, the contact section 54 and the anchoring 55 can be embodied integrally. In this case, as illustrated in FIG. 10, the power terminal 51 can be embodied in a U-shaped fashion in plan view, for example. A conductor track 70 connected to the contact section 54 by means of bonding wires 91, 92, ..., 9n run for example along a transverse side of the module 1 on the power electronics substrate 20.

Figure 11:
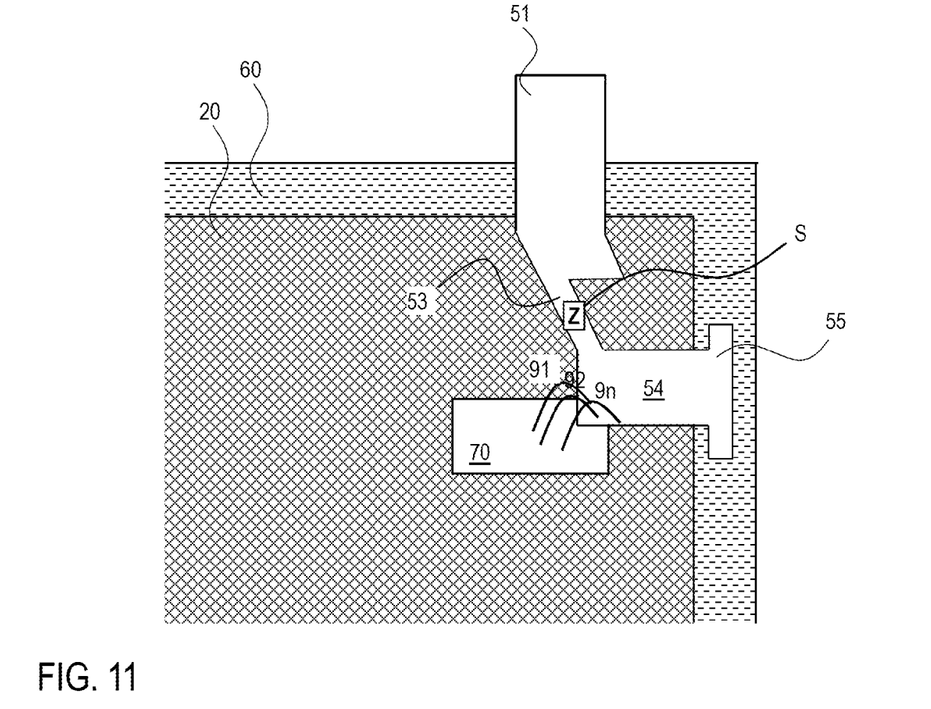
FIG. 11 shows a schematic plan view of a further power semiconductor module with a power terminal and a current sensor at the third position, according to an embodiment.

However, the power terminal 51 can also be arranged in a corner of the module 1, for example. Such an arrangement is illustrated by way of example in FIG. 11. In this case, the power terminal 51 furthermore projects on the module frame 60 at the first longitudinal side L1. The inner section $51_I$ of the power terminal 51, in the same way as the bridge 53, can run diagonally in the direction of a transverse side of the module 1. The adjacent contact section 54 can be embodied in a square or rectangular fashion, for example, and can have an anchoring 55 which projects into the module frame 60 on the transverse side and is potted therein. The conductor track 70 can run parallel to the first longitudinal side L1, for example. However, the arrangements illustrated are merely examples. Depending on the application and space present on the power electronics substrate 20, the power terminal 51 can also have any other shapes and be arranged at other locations in the module 1.

The current sensor S can be a magnetic current sensor (e.g., a Hall sensor) or a shunt current sensor, for example. Magnetic current sensors measure an electric current indirectly by way of the magnetic field generated thereby. Consequently, the measuring circuit is electrically isolated from the current to be measured. In this case, various current sensors having a magnetic-flux-guiding core and also various coreless current sensors are already known in the prior art. In the case of the latter, magnetic field sensors can be arranged near an edge or a slot. Both sensors having a core and sensors without a core taper the conductor cross section. Boosts of the current density and of the magnetic fields resulting therefrom then occur, which can be measured by such magnetic field sensors. If the geometrical dimensions are known, the current to be determined can be ascertained by means of a calibration factor.

Shunt current sensors measure the voltage drop across an electrical conductor (measuring resistor) if current flows through the latter. An electrical coupling of the sensor and of the current to be measured is required for this purpose. However, with the use of shunt current sensors, the data representing the measured current can be transmitted to an evaluation circuit by inductive coupling, for example, and so the evaluation circuit is electrically isolated from the current to be measured. Shunt current sensors are also known per se from the prior art. In this case, the measuring resistor can be represented by a highly conductive material (e.g., copper or aluminum alloys) and the geometrical shaping of the power terminal 51 (or of a part of the power terminal). In this case, the current sensor S can comprise a temperature sensor. The temperature response of the electrical resistivity can then be determined by means of a suitable algorithm. However, it is also possible to produce the power terminal 51 (or a part of the power terminal) from a material (e.g., specific alloys) whose electrical conductivity has substantially no temperature dependence.

If a magnetic sensor S is used for measuring the current of a power terminal 51, then the arrangement of the sensor S on the bridge 53 affords the advantage that the magnetic field is particularly strong at this taper since the current lines are compressed here. In this case, the sensor S can be connected to the bridge 53 via an insulation layer 56 that is large in relation to the current sensor S. In this case, the insulation layer 56 can for example extend beyond the bridge 53 and also cover parts of the power electronics substrate 20, of the inner section $51_I$ and of the contact section 54. The insulation layer 56 can be applied by adhesive bonding or soldering, for example. For soldering purposes, the insulation layer 56 can have for example fine strips of copper on its side facing the power electronics substrate 20. The sensor S can likewise be adhesively bonded or soldered, for example, onto the insulation layer 56. The insulation layer 56 can also have fine strips of copper on its top side, for the soldering of the sensor S. In this case, the size of the insulation layer 56 can be chosen in such a way that the creepage paths between the sensor S and the power terminal 51 are as large as possible.

Figure 12:
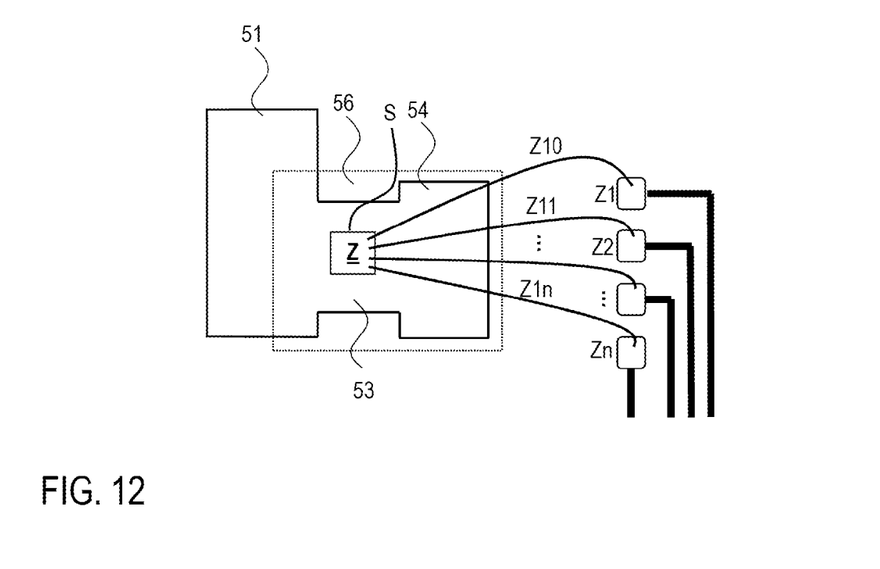
FIG. 12 shows a schematic plan view of a power terminal with a magnetic current sensor at the third position, according to an embodiment.

The sensor S can be contacted directly by means of bonding wires Z10, Z11, . . . , Z1n, as illustrated in FIG. 12. By means of the bonding wires Z10, Z11, . . . , Z1n, the sensor S can be connected to bonding pads Z1, Z2, . . . , Zn arranged on the power electronics substrate 20. From the bonding pads Z1, Z2, . . . , Zn, conductor tracks can be led for example parallel to a transverse side of the module 1 on the power electronics substrate 20 as far as the opposite second longitudinal side L2. In this way, the sensor S can be connected to at least one of the further terminals 52 (see FIG. 2, for example) at the second longitudinal side L2. One of the further terminals 52 can for example receive the signals representing the measured current from the sensor S and transmit them to corresponding evaluation units for further evaluation.

Figure 13:
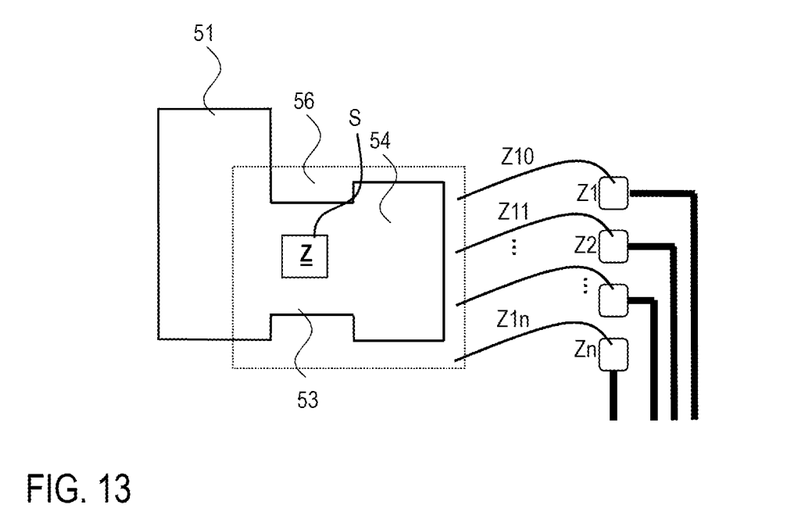
FIG. 13 shows a schematic plan view of a further power terminal with a magnetic current sensor at the third position, according to an embodiment.

However, it is not necessary for the sensor S to be connected to the bonding pads Z1, Z2, . . . , Zn on the power electronics substrate 20 directly by means of bonding wires Z10, Z11, . . . , Z1n. The bonding wires Z10, Z11, . . . , Z1n can for example also connect the bonding pads Z1, Z2, . . . , Zn to thin conductor tracks on the insulation layer 56. This is illustrated schematically in FIG. 13, wherein the thin conductor tracks have been omitted for reasons of clarity. On the insulation layer 56, the conductor tracks can lead to the sensor S. The sensor S can be connected to the conductor tracks for example by means of so-called flip-chip mounting (e.g. by soldering). In this way, an active surface of the sensor S, said active surface having the components and magnetic field sensors, faces the bridge 53. This has the advantage that the distance between the bridge 53 with the current lines and the magnetic field sensors decreases and the sensors can thus measure larger magnetic fields per ampere current. However, the sensor S can also be connected to the conductor tracks on the insulation layer 56 by means of further bonding wires (not illustrated in FIG. 13). This has the advantage that the bonding wires Z10, Z11, . . . , Z1n can be shorter than in the case of a direct contacting of the sensor S. The loops of the shorter bonding wires Z10, Z11, . . . , Z1n project with a smaller height over the power electronics substrate, such that a smaller filling level of the insulation gel in the housing is required. The costs of the power semiconductor module 1 can be reduced as a result.

Figure 14:
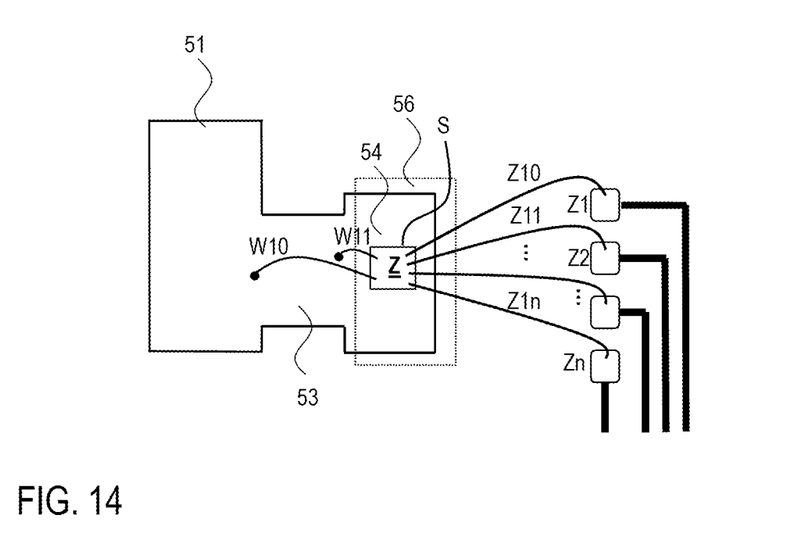
FIG. 14 shows a schematic plan view of a power terminal with a shunt current sensor at the third position, according to an embodiment.

If a shunt current sensor is used, then the bridge 53 is not necessary for generating the strongest possible magnetic field, but rather for setting the resistance value of the sensor S. A voltage proportional to the resistance value is dropped across the bridge 53. This voltage drop can be for example up to 1 mV or up to 10 mV. The sensor S can be connected to a first side of the bridge 53 by means of a first measuring wire W10 and to a second side of the bridge 53 by means of a second measuring wire W11. In this regard, the voltage drop across the bridge 53 can be detected by the sensor S (so-called full-conductor measurement). A shunt current sensor generally comprises a plurality of components such as, for example, the shunt (here the bridge 53), the measuring wires W10, W11 and a sensor module comprising the evaluation electronics. Hereinafter, in the case of the shunt current sensor, however, only the sensor module having electronics is designated as sensor S. Such an arrangement is illustrated by way of example in FIG. 14. In order to establish an electrical isolation of the current to be measured and the sensor S having the evaluation electronics, the sensor S can comprise two semiconductor chips, for example, which define a high-voltage side and a low-voltage side. Data can be transmitted between the two chips for example by means of transformers ("coreless transformers"). In this way, for example, energy can also be transmitted between the two chips.

The sensor S can in turn be contacted directly by means of bonding wires Z10, Z11, . . . , Z1n. The sensor S can be arranged on the contact section 54, for example. An arrangement of the evaluation electronics on the bridge 53 affords the advantage of a good thermal coupling of the sensor S and the bridge 53. The sensor S can thus detect an intrinsic heating in the region of the bridge 53 more accurately, as a result of which possible measurement errors on account of the temperature dependence of the electrical conductivity of the bridge 53 can be better corrected. In the case of an arrangement of the sensor S on the contact section 54, the distance to the bonding pads Z1, Z2, . . . , Zn is smaller than in the case of an arrangement above the bridge 53. However, it is also possible, as described with reference to FIG. 13, to contact the sensor S by means of conductor tracks on the insulation layer 56 and to provide bonding wires between the insulation layer 56 and the bonding pads.

Figure 15:
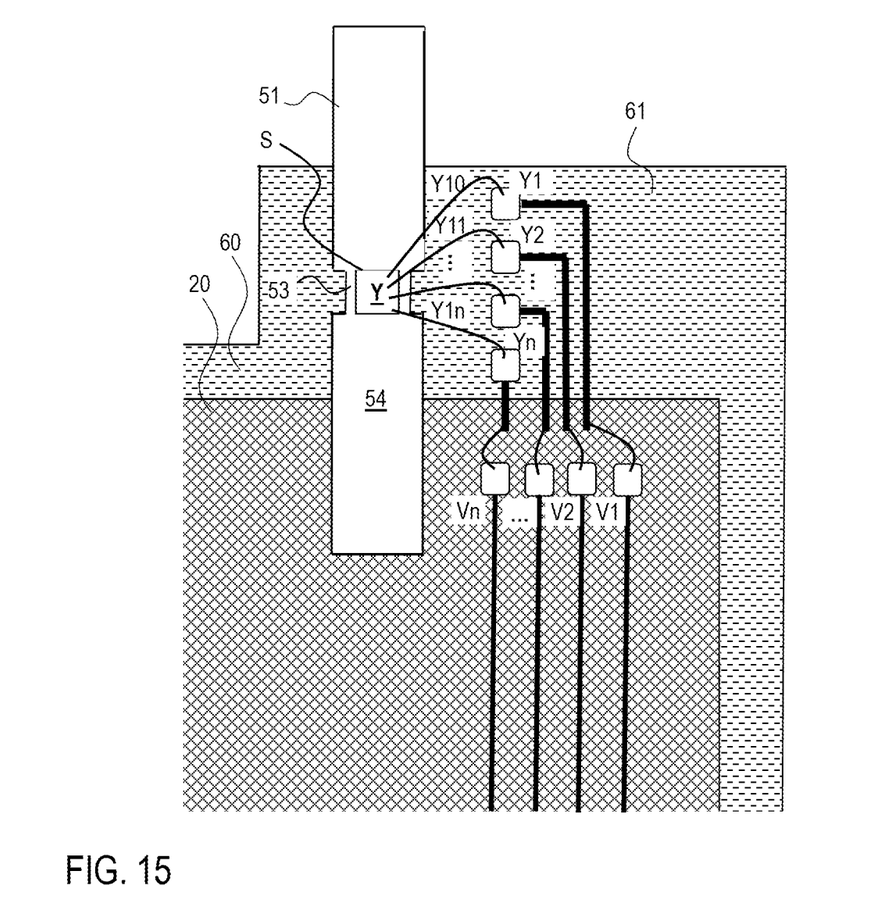
FIG. 15 shows a schematic plan view of a power semiconductor module with a power terminal and a current sensor at the second position, according to an embodiment.

As already described above, the sensor S can also be arranged at the second position Y and be enclosed by the module frame 60. FIG. 15 schematically illustrates an excerpt from such a module 1. The module frame 60 has a projection 61, through which the connection section 51v of the power terminal 51 runs. In the case of the arrangement of the sensor S at the second position Y, the bridge 53 can be arranged in the connection section 51v of the power terminal 51. The bridge 53 then lies in the region of the projection 61 and is enclosed by the material of the module frame 60. The sensor S can be arranged on the bridge 53. If a magnetic current sensor S is used, then once again the current lines are compressed in the region of the bridge 53, as a result of which the magnetic field is amplified. A shunt current sensor S can also be arranged in the region of the bridge 53 or, as described with reference to FIG. 14, for example also in the region of the contact section 54. The sensor S can be connected to the power terminal 51 by means of a large insulation layer (e.g., composed of glass or polyimide). An insulation layer is not illustrated in FIG. 15, however, for reasons of clarity.

For contacting the sensor S, sensor terminals are arranged in the projection 61. The sensor terminals can be arranged on a printed circuit board, for example. The sensor S is connected to the sensor terminals by means of bonding wires Y10, Y11, . . . , Yn, wherein the sensor terminals can have bonding pads Y1, Y2, . . . Yn for this purpose, in order to produce a bonding connection. However, the sensor S can also be connected to the sensor terminals by means of soldering methods or adhesive-bonding methods, for example. The sensor S can be connected to the sensor terminals before both are molded into the module frame 60. The sensor terminals in the module frame 60 can be connected by means of further bonding connections to conductor tracks V1, V2, . . . , Vn on the power electronics substrate 20. On the power electronics substrate 20, the conductor tracks V1, V2, . . . , Vn can run for example parallel to the transverse sides as far as the second longitudinal side L2, where they are connected to at least one of the further terminals 52 (e.g., by means of bonding connections).

Figure 16:
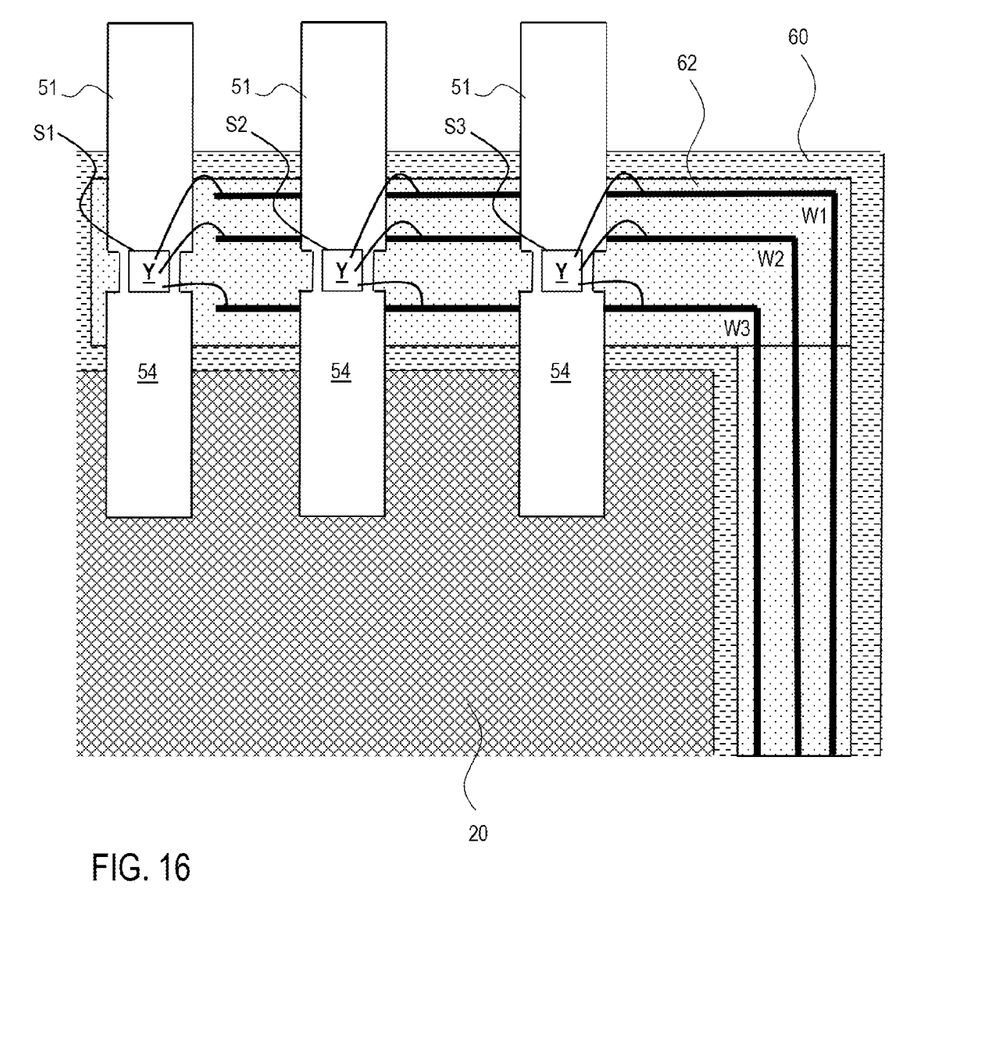
FIG. 16 shows a schematic plan view of a power semiconductor module with a plurality of power terminals and current sensors at the second position, according to an embodiment.

However, it is also possible to lead conductor tracks W1, W2, Wn on a printed circuit board 62 within the module frame 60 as far as the second longitudinal side L2, as illustrated in FIG. 16. For this purpose, the module frame 60 is made wider over a corresponding length, in particular over a portion of the longitudinal sides L1, L2 and over the entire transverse side, in order to be able to accommodate the printed circuit board 62 with the conductor tracks W1, W2, Wn. By way of example, a plurality of power terminals 51 can be connected to the printed circuit board 62 if a current measurement is desired in more than one power terminal 51. The printed circuit board 62 has an L-shape, for example, and runs from the power terminals 51 at the first longitudinal side L1 via the transverse side as far as the further terminals 52 at the second longitudinal side L2 (not illustrated in FIG. 16). By virtue of the fact that the conductor tracks W1, W2, Wn are led on the printed circuit board 62 in the module frame 60, no additional space is required therefore on the power electronics substrate 20.

The printed circuit board 62 can be for example a multi-layered PCB (PCB=printed circuit board). In this case, the conductor tracks can be embodied on a surface of the PCB, but they can also be situated on a layer within the PCB. If the conductor tracks lie within the PCB, they are well insulated from the power terminals 51 running on the first longitudinal side L1 above the PCB. However, the conductor tracks can also be formed on the side (e.g., the underside) of the PCB facing away from the power terminals 51, thus resulting in even better insulation with respect to the power terminals 51 running above the PCB. In some embodiments, the power terminals 51 can be connected to the printed circuit board 62 by soldering, for example. The mechanical stability of the power terminals 51 can be increased in this way. In this case, soldered joints can be situated for example at the two ends of the bridge 53. The soldered joints can be arranged in such a way that the entire current flows through the bridge 53 and the soldered joints do not cause any inaccuracies during the measurement.

The printed circuit board 62 can be completely molded into the module frame 60. However, it is also possible that only the regions of the printed circuit board 62 in which a connection to the power terminals 51 or at least one further terminal 52 is produced are enclosed by the module frame 60 and further parts of the printed circuit board 62 in which the conductor tracks run are not enclosed by the module frame 60. More conductor tracks per unit area can be arranged in a PCB than in the power electronics substrate 20. Consequently, in the case of this solution less additional space is required than in the case of an arrangement of the conductor tracks on the power electronics substrate 20, as described for example with reference to FIG. 15. In the case of all of the arrangements described, the course of the cooling device on the underside (and optionally the top side, along the first surface 201) of the module 1 is not impaired. In this case, passive components such as resistors or capacitors, for example, can optionally also be arranged on the printed circuit board 62. As a result, these passive components can be positioned in proximity to the current sensors S, which is advantageous for EMC robustness.

What is claimed is:

1. A power semiconductor module, comprising:
   a power electronics substrate having a first surface, a second surface opposite the first surface, a first longitudinal side and a second longitudinal side opposite the first longitudinal side;
   a module frame, which is arranged in such a way that it encloses the power electronics substrate;
   at least one power terminal which is arranged at the first longitudinal side and which extends at least partially through the module frame;
   a further terminal, which is arranged at the second longitudinal side and which extends at least partially through the module frame;
   at least one power semiconductor component which is arranged on the first surface of the power electronics substrate and is electrically connected to at least one power terminal; and
   at least one current sensor which is designed to measure a current in a power terminal, wherein the at least one current sensor is arranged on the power terminal and has a signal output connected to the further terminal.

2. The power semiconductor module as claimed in claim 1, wherein the at least one power terminal has an inner section extending within the module frame, an outer section extending outside the module frame, and a connection section extending through the module frame.

3. The power semiconductor module as claimed in claim 2, wherein the current sensor is directly connected to the inner section of the power terminal.

4. The power semiconductor module as claimed in claim 2, wherein the current sensor is directly connected to the outer section of the power terminal.

5. The power semiconductor module as claimed in claim 2, wherein the current sensor is directly connected to the connection section of the power terminal.

6. The power semiconductor module as claimed in claim 2, wherein the power terminal has a bridge, which connects the power terminal to a contact section.

7. The power semiconductor module as claimed in claim 6, wherein the bridge at least partly extends through the module frame.

8. The power semiconductor module as claimed in claim 6, wherein the bridge is connected to the inner section of the power terminal and extends in the interior of the module frame.

9. The power semiconductor module as claimed in claim 6, wherein the current sensor is arranged on the bridge.

10. The power semiconductor module as claimed in claim 9, wherein the current sensor is a magnetic current sensor designed to measure a current in the power terminal on the basis of a magnetic field generated by the current.

11. The power semiconductor module as claimed in claim 1, wherein the current sensor is a shunt current sensor designed to measure a voltage drop across the bridge and to determine therefrom the current flowing in the power terminal.

12. The power semiconductor module as claimed in claim 9, wherein an insulation layer is arranged between the current sensor and the power electronics substrate.

13. The power semiconductor module as claimed in claim 1, which furthermore comprises conductor tracks configured to connect the current sensor to the further terminal.

14. The power semiconductor module as claimed in claim 13, wherein the current sensor is connected to the conductor tracks by means of bonding wires.

15. The power semiconductor module as claimed in claim 13, which furthermore has at least one transverse side, wherein the first longitudinal side and the second longitudinal side are connected by the at least one transverse side, and wherein conductor tracks run from the first longitudinal side to the second longitudinal side.

16. The power semiconductor module as claimed in claim 13, wherein the conductor tracks run on the power electronics substrate from the first longitudinal side to the second longitudinal side.

17. The power semiconductor module as claimed in claim 13, wherein the conductor tracks run within the module frame on a circuit board from the first longitudinal side to the second longitudinal side.

18. A system comprising at least two of the power semiconductor modules as claimed in claim 1, wherein the at least two power semiconductor modules comprise a common cooling device, which runs along the second surface of the power electronics substrate and which is configured to cool the power electronics substrate and the power semiconductor components arranged thereon.

19. The system as claimed in claim 18, wherein a metallic baseplate is arranged between the power electronics substrate and the cooling device.

20. The system as claimed in claim 18, wherein the cooling device comprises a cooling tube configured to guide a cooling liquid in its interior.

21. The system as claimed in claim 18, wherein the at least two power semiconductor modules comprise a second common cooling device, which runs along the first surface of the power electronics substrate.

* * * * *